United States Patent
Sakaguchi et al.

(10) Patent No.: US 8,106,690 B2
(45) Date of Patent: Jan. 31, 2012

(54) SEMICONDUCTOR INTEGRATED CIRCUIT DEVICE

(75) Inventors: Jiro Sakaguchi, Kanagawa (JP); Moriyoshi Ota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/909,232

(22) Filed: Oct. 21, 2010

(65) Prior Publication Data

US 2011/0109355 A1    May 12, 2011

(30) Foreign Application Priority Data

Nov. 12, 2009  (JP) .................................. 2009-258835

(51) Int. Cl.
   *H03L 7/06*    (2006.01)
(52) U.S. Cl. ........................................ 327/156; 327/147
(58) Field of Classification Search .................. 327/147, 327/156
   See application file for complete search history.

(56) References Cited

U.S. PATENT DOCUMENTS

| | | | | |
|---|---|---|---|---|
| 6,703,902 B2* | 3/2004 | Jeon et al. | ....................... | 331/17 |
| 7,541,853 B2* | 6/2009 | Nakadaira | ..................... | 327/241 |
| 7,885,353 B2* | 2/2011 | Nakadaira | ..................... | 375/303 |
| 7,912,109 B1* | 3/2011 | Li | .................. | 375/130 |
| 2003/0039330 A1* | 2/2003 | Castiglione et al. | .......... | 375/376 |
| 2004/0252751 A1* | 12/2004 | Ogasawara | .................... | 375/130 |
| 2010/0097102 A1* | 4/2010 | Masaki | .......................... | 327/43 |
| 2010/0127739 A1* | 5/2010 | Ebuchi et al. | ................. | 327/148 |
| 2010/0315172 A1* | 12/2010 | Kanda | ............................. | 331/18 |
| 2011/0019718 A1* | 1/2011 | Chiang et al. | ................. | 375/141 |
| 2011/0103427 A1* | 5/2011 | Bafra et al. | ................... | 375/130 |
| 2011/0109355 A1* | 5/2011 | Sakaguchi et al. | ............. | 327/157 |
| 2011/0204940 A1* | 8/2011 | Kanda | ........................... | 327/157 |

FOREIGN PATENT DOCUMENTS

JP    2006-21108 A    8/2006

* cited by examiner

*Primary Examiner* — Lincoln Donovan
*Assistant Examiner* — Adam Houston
(74) *Attorney, Agent, or Firm* — Mattingly & Malur, PC

(57) ABSTRACT

To generate a highly accurate SSC while reducing the circuit area of a clock generation circuit that generates a normal clock and an SSC. A clock signal output from a voltage controlled oscillator is frequency-divided by a frequency divider, and is output as a first frequency-divided clock to a selector. The frequency divider outputs a plurality of second frequency-divided clocks each shifted in phase by 1/m of a period based on a control signal of a control circuit. The selector selects two frequency-divided clocks having the closest phase shift from among the first and second frequency-divided clocks. Based on a weighting data signal output from the control circuit, a phase interpolation circuit phase-shifts the frequency-divided clock by a phase shift obtained by dividing the phase difference between the two frequency-divided clocks, and outputs the resultant clock as an output clock.

7 Claims, 5 Drawing Sheets

| EDGE NO. | RELATIVE DELAY TIME | |
|---|---|---|
| 0 | 0 | |
| 1 | $\Delta$ | $\Delta = Tosc/(m \cdot n)$ |
| 2 | $2\Delta$ | |
| 3 | $3\Delta$ | |
| .. | .. | |
| n | $n\Delta$ | $(= Tosc/m)$ |
| n+1 | $(n+1)\Delta$ | |
| .. | .. | |
| 2n | $2n\Delta$ | $(= 2Tosc/m)$ |
| .. | .. | |
| mn−1 | $(mn-1)\Delta$ | $(= Tosc - \Delta)$ |

SEMICONDUCTOR INTEGRATED CIRCUIT DEVICE

CROSS-REFERENCE TO RELATED APPLICATION

The disclosure of Japanese Patent Application No. 2009-258835 filed on Nov. 12, 2009 including the specification, drawings and abstract is incorporated herein by reference in its entirety.

BACKGROUND OF THE INVENTION

The present invention relates to a clock generation technology used in a semiconductor integrated circuit device, and more particularly to a technology that is effective in generating a frequency modulation clock to slightly vary the frequency of a clock signal.

In recent years, in semiconductor integrated circuit devices such as microcomputers, it has been increasingly required to incorporate a spread spectrum clock generator (SSCG) that, when clocks are generated, generates so-called a spread spectrum clock (SSC) which is a frequency modulation clock in order to cope with electromagnetic interference (EMI).

The SSC is used to decrease EMI by slightly varying the frequency of a clock signal to reduce the peak value of the frequency spectrum of the clock signal and thereby reduce radiation noise.

Some semiconductor integrated circuit devices have not only circuit blocks such as a CPU which can be operated by the SSC but also circuit blocks for which the SSC cannot be used; in this case, it is necessary to generate two types of clocks. The circuit blocks for which the SSC cannot be used include, for example, interfaces such as USB, FLexRay and CAN.

When two types of clocks are generated in the semiconductor integrated circuit device as described above, it is common that the SSCG for generating the SSC and a PLL (phase locked loop) for generating a pure clock other than the SSC are used together.

In general, the PLL includes a phase comparator, a charge pump circuit, a low-pass filter, a voltage controlled oscillator (VCO) and a feedback frequency divider; as an output clock output from the PLL, a clock having N times the frequency of a reference input clock is output. Since the frequency division number N of the feedback frequency divider is an integer, the period of the output clock of the PLL is a fixed value of 1/N times the period of the reference input clock.

There are various types of configurations of the SSCG depending on its mode, and most of the configurations are similar to those of the PLL; the configuration in which the modulation is performed with the frequency division number of the feedback frequency divider constituting the PLL is commonly known.

In this case, the SSCG includes a phase comparator, a charge pump circuit, a low-pass filter, a voltage controlled oscillator, a feedback frequency divider, a $\Delta\Sigma$ modulator and a modulation wave generator.

The feedback frequency divider can switch the frequency division number between two types, that is, N and (N−1), selects a use ratio of the integer N and the integer (N−1) during a given time period to obtain as an average frequency division number a non-integral value between N and (N−1) and sequentially changes this use ratio to output as an output clock the SSC whose period is varied from a reference input clock having a constant period.

As this type of spread spectrum clock generator, there is known a spread spectrum clock generator including: for example, a PLL that outputs four-phase clocks whose phases are shifted by 90 degrees with each other; a phase interpolation control circuit that operates in synchronization with a reference clock and outputs control signals which periodically and repeatedly vary in a constant pattern according to each of the four-phase clocks and which assign weights between adjacent two-phase clocks among the four-phase clocks; a phase interpolator that assigns weights to each of the adjacent two-phase clocks according to the control signal for each of the adjacent two-phase clocks to combine them together, that interpolates the phase between them in a predetermined phase for all adjacent two-phase clocks and that outputs the clock obtained by interpolating the phase as a spread spectrum clock (see patent document 1 (Japanese Patent Laid-Open No. 2006-211208)).

SUMMARY OF THE INVENTION

However, in the above-described semiconductor integrated circuit device, the inventors of the present invention have found that the technology where two types of clocks, that is, a normal clock and an SSC are generated has the following problems.

Specifically, in the SSCG configured as described above, it is necessary to set the band of a low-pass filter sufficiently low because, in order to obtain a non-integral value as the frequency division number through the use ratio of the frequency division number N and the frequency division number (N−1), it is necessary to perform averaging processing and the low-pass filter of the PLL serves to perform it.

This causes the band to be lowered than that of the similar PLL having N times the integer, and the size of a filter to be increased, resulting in that the area used exclusively by the SSCG is increased. Disadvantageously, this makes it difficult to reduce the size of a semiconductor integrated circuit device.

Since the SSCG uses the low-pass filter of the PLL as described above, the triangular wave modulation frequency of the SSC is limited by the band of the PLL. When the band of the PLL is low, the high-frequency component of the modulation frequency is attenuated, and thus the output of the SSC does not indicate the modulation of the triangular wave, with the result that an EMI attenuation is lowered.

The band of the PLL has an upper limit due to its stability and the reduction of ripples of the input of a voltage controlled oscillator, and thus it is impossible to select a high modulation frequency.

Furthermore, the configuration using the low-pass filter of the PLL disadvantageously causes its pulse width to be inevitably wider than that of a locked pulse of the PLL, and the control voltage of the voltage controlled oscillator to be disturbed. This makes it impossible for the SSCG to achieve Jitter performance comparable to that of the PLL.

The present invention has been made in view of the above circumstances and provides a technology with which to generate high-accuracy SSCs while reducing the area of a clock generation circuit generating normal clocks and SSCs.

The other purposes and the new feature of the present invention will become clear from the description of the present specification and the accompanying drawings.

The following explains briefly the outline of a typical invention among the inventions disclosed in the present application.

According to the present invention, there is provided a semiconductor integrated circuit device comprising a clock generation circuit that includes: a PLL generating a first clock signal equal in frequency to a reference clock signal and a plurality of second clock signals each arbitrarily shifted in phase from the first clock signal; and a spread spectrum clock generator generating a frequency modulation clock signal which modulates the frequencies of the first and second clock signals generated by the PLL to spread an electromagnetic spectrum, wherein the spread spectrum clock generator includes: a frequency divider that frequency-divides the first clock signal output from the PLL; a frequency-divided clock generator that outputs a frequency-divided signal frequency-divided by the frequency divider based on the phase-shifted second clock signals output from the PLL to generate phase-shifted multiphase frequency-divided clocks; a frequency-divided clock selector that selects and outputs any two frequency-divided clocks whose phases are different from and closest to each other from among the multiphase frequency-divided clocks generated by the frequency-divided clock generator; a phase interpolation circuit that phase-shifts the frequency-divided clock by a phase shift obtained by dividing the phase difference between the two frequency-divided clocks from the two frequency-divided clocks selected by the frequency-divided clock selector and that outputs the resultant clock as the frequency modulation clock signal; and a control circuit that controls the frequency-divided clock selector and the phase interpolation circuit such that a period of the frequency modulation clock signal output from the phase interpolation circuit differs from a period of the first clock signal output form the PLL.

Other inventions of the present application will be described briefly.

In the present invention, the control circuit outputs to the frequency-divided clock selector a selection signal that controls so as to select and output any two frequency-divided clocks from among the multiphase frequency-divided clocks output from the frequency-divided clock generator, outputs to the phase interpolation circuit weighting data for the phase interpolation circuit to divide the phase difference between the frequency-divided clocks output from the frequency-divided clock selector, and performs control so that the frequency modulation clock output from the phase interpolation circuit changes a frequency thereof at any period.

Moreover, in the present invention, the frequency divider arbitrarily switches a frequency division ratio based on a frequency-division-ratio switching signal output from the control signal, and the control circuit controls so as to switch the frequency division ratio each time the phase shift of the frequency modulation clock output from the phase interpolation circuit exceeds one period of the first clock signal output from the PLL.

Furthermore, in the present invention, the control circuit operates in synchronization with the most delayed frequency-divided clock among the multiphase frequency-divided clocks output from the frequency-divided clock generator.

The following explains briefly the effect acquired by the typical invention among the inventions disclosed in the present application.

(1) It is possible to reduce the circuit area of a clock generation circuit and the size of a semiconductor integrated circuit device.

(2) It is possible to generate highly accurate SSCs without reducing an EMI attenuation and enhance an anti-EMI performance in a semiconductor integrated circuit device.

DETAILED DESCRIPTION OF THE PREFERRED EMBODIMENTS

An embodiment of the present invention will be described below with reference to the accompanying drawings. In all the drawings for explaining embodiments, the same symbol is attached to the same member, as a principle, and the repeated explanation thereof is omitted.

Figure 1:
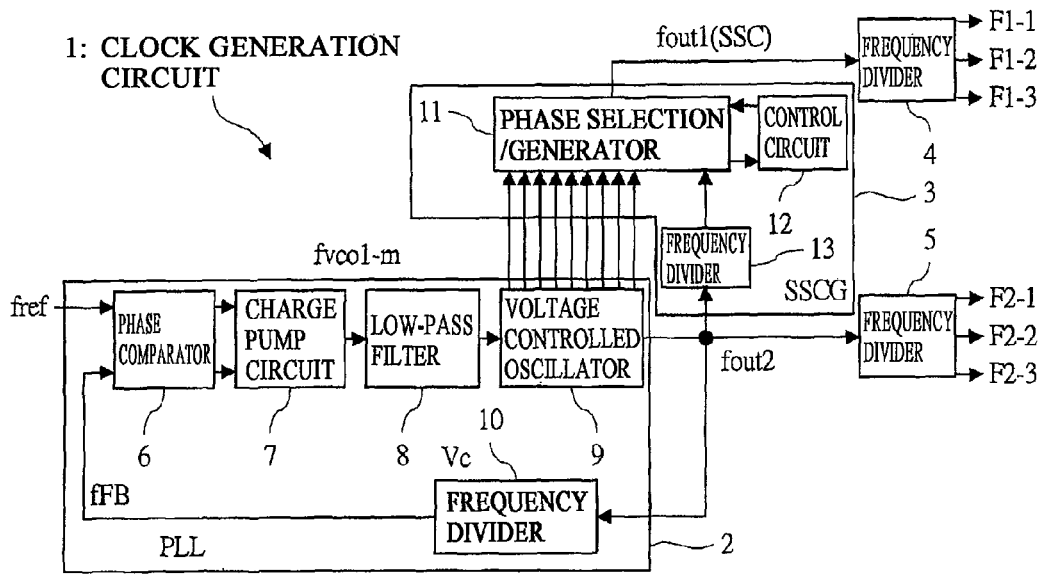
FIG. 1 is a block diagram showing an example of a clock generation circuit included in a semiconductor integrated circuit device according to an embodiment of the present invention.
Figure 2:
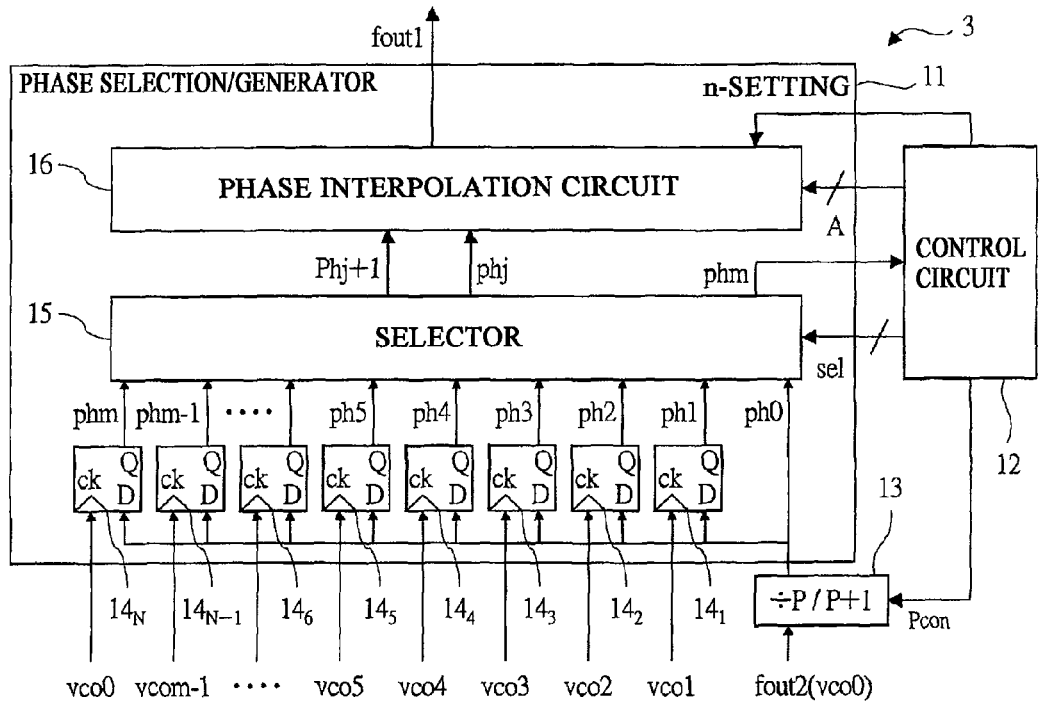
FIG. 2 is a block diagram showing an example of the configuration of a phase selection/generator provided in the clock generation circuit of FIG. 1.
Figure 3:
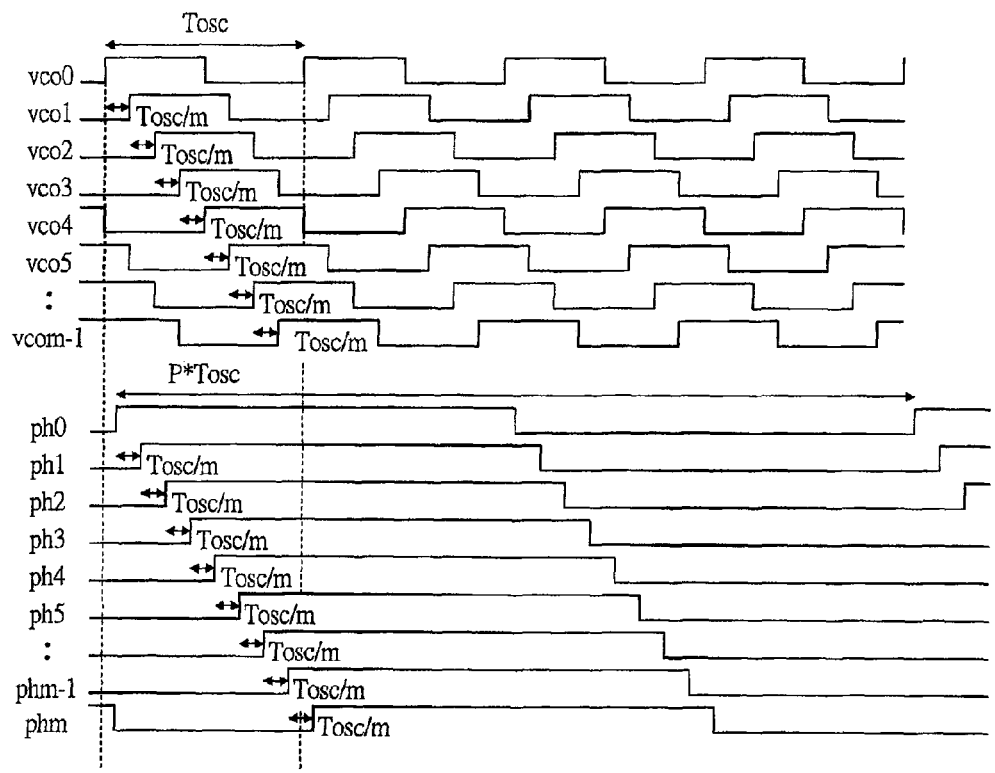
FIG. 3 is a timing chart showing an example of multiphase clock signals output from a voltage controlled oscillator in the clock generation circuit of FIG. 1, a frequency-divided clock output from a frequency divider and multiphase frequency-divided clocks output from the flip-flops of FIG. 2.
Figure 4:
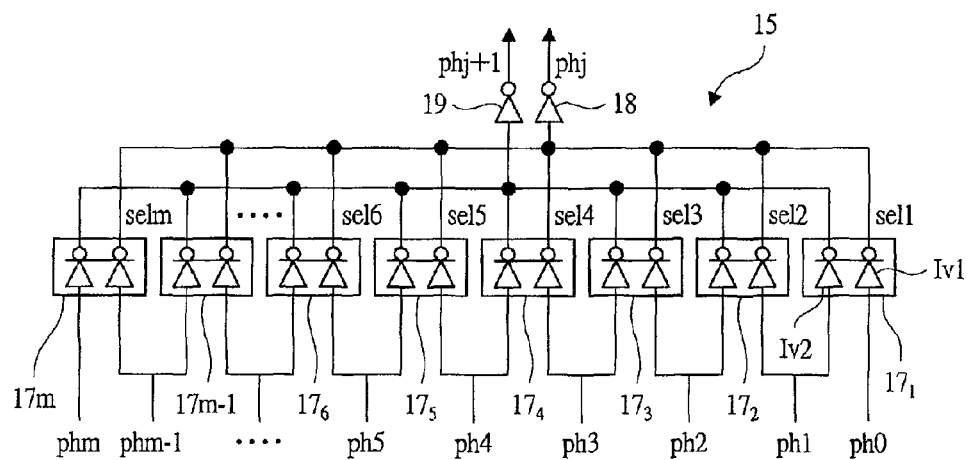
FIG. 4 is a circuit diagram showing an example of the configuration of a selector provided in the phase selection/generator of FIG. 2.
Figure 5:
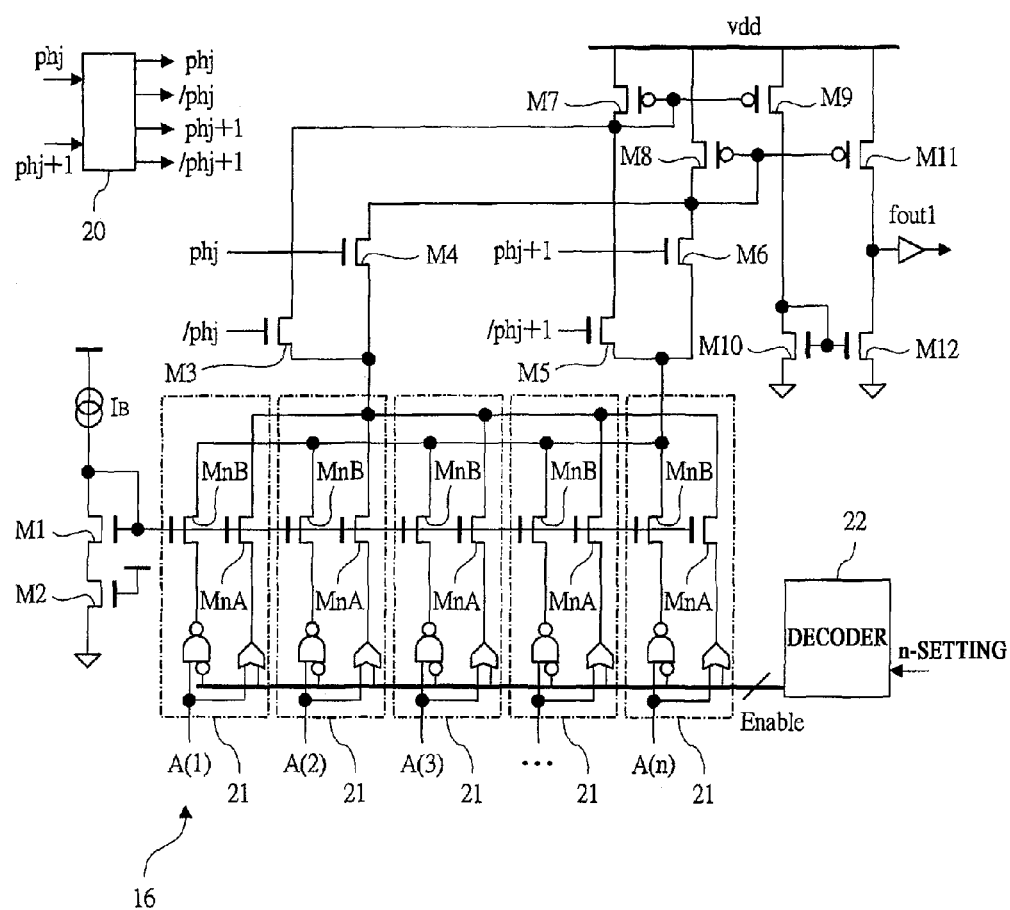
FIG. 5 is a circuit diagram showing an example of the configuration of a phase interpolation circuit provided in the phase selection/generator of FIG. 2.
Figure 6:
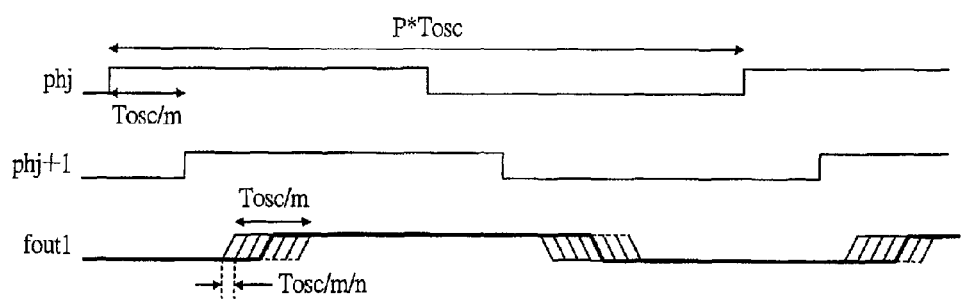
FIG. 6 is a timing chart showing an example of a frequency-divided clock and an output clock output from the selector in the phase interpolation circuit of FIG. 5.
Figures 7, 8:
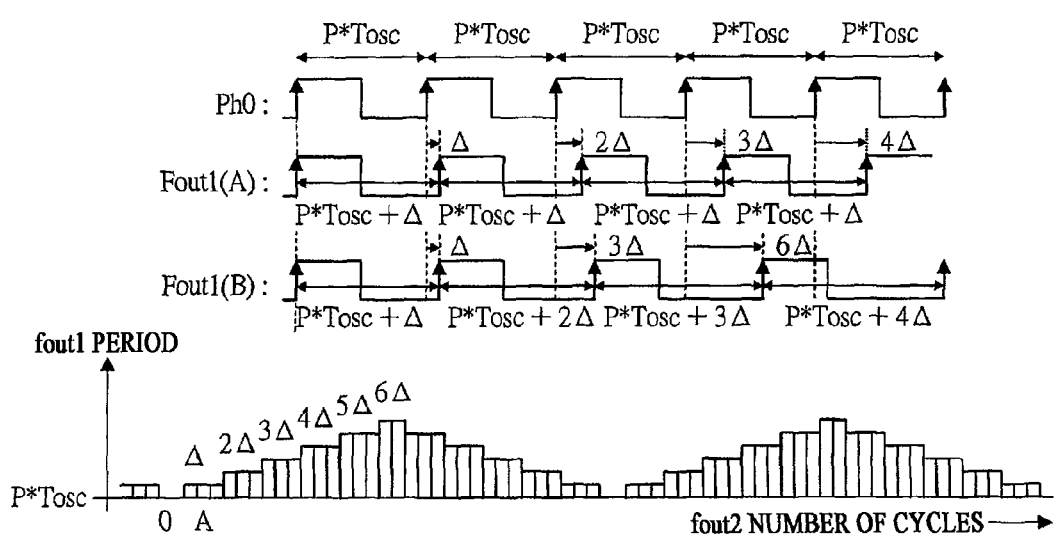
FIG. 7 is an illustration showing an example of the output clock that has the different relative delay times and that is output from a SSCG of FIG. 2.
FIG. 8 is an illustration showing an example of an output period of the output clock output from the SSCG of FIG. 2.
Figure 9:
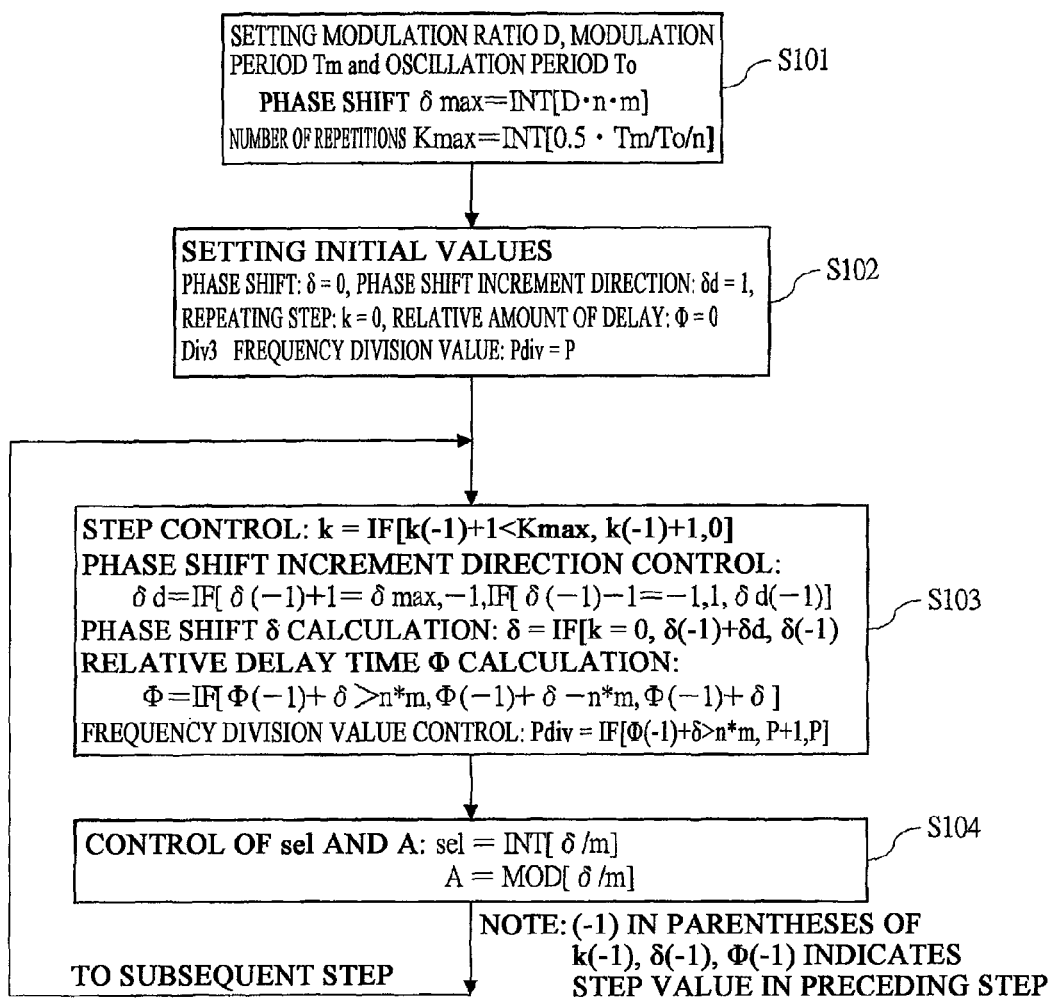
FIG. 9 is a flowchart showing an example of the operation of a control circuit of FIG. 2.

FIG. 1 is a block diagram showing an example of a clock generation circuit included in a semiconductor integrated circuit device according to an embodiment of the present invention; FIG. 2 is a block diagram showing an example of the configuration of a phase selection/generator provided in the clock generation circuit of FIG. 1; FIG. 3 is a timing chart showing an example of multiphase clock signals output from a voltage controlled oscillator in the clock generation circuit of FIG. 1, a frequency-divided clock output from a frequency divider and multiphase frequency-divided clocks output from the flip-flops of FIG. 2; FIG. 4 is a circuit diagram showing an example of the configuration of a selector provided in the phase selection/generator of FIG. 2; FIG. 5 is a circuit diagram showing an example of the configuration of a phase interpolation circuit provided in the phase selection/generator of FIG. 2; FIG. 6 is a timing chart showing an example of a frequency-divided clock and an output clock output from the selector in the phase interpolation circuit of FIG. 5; FIG. 7 is an illustration showing an example of the output clocks that have the different relative delay times and that are output from a SSCG of FIG. 2; FIG. 8 is an illustration showing an example of an output period of the output clock output from the SSCG of FIG. 2; and FIG. 9 is a flowchart showing an example of the operation of a control circuit of FIG. 2.

In the present embodiment, a clock generation circuit 1 is included in a semiconductor integrated circuit device such as a microcomputer. The clock generation circuit 1 generates clock signals which are frequency modulation clocks (SSC) slightly varying the frequency of clocks and normal clock signals other than the SSCs.

As shown in FIG. 1, the clock generation circuit 1 includes a PLL 2, a spread spectrum clock generator (SSCG) 3 and frequency dividers 4 and 5. The PPL 2 includes a phase comparator 6, a charge pump circuit 7, a low-pass filter 8, a voltage controlled oscillator 9 and a frequency divider 10. The spread spectrum clock generator 3 includes a phase selection/generator 11, a control circuit 12 and a frequency divider 13.

A feedback clock signal fFB output from the frequency divider 10 and a reference clock signal fref input from outside are input to the input portion of the phase comparator 6; the charge pump circuit 7 is coupled to the output portion of the phase comparator 6.

The phase comparator 6 detects a time difference as a phase difference between the reference clock signal fref and the feedback clock signal fFB that have been input, and outputs a pulse of the same degree as the time difference. The charge pump circuit 7 generates a current corresponding to the pulse of the phase comparator 6.

The low-pass filter 8 is coupled to the charge pump circuit 7. The voltage controlled oscillator 9 is coupled to the output portion of the low-pass filter 8. The low-pass filter 8 eliminates high-frequency noise superimposed on the reference clock signal fref, and outputs it to the voltage controlled oscillator 9 as a control voltage.

The voltage controlled oscillator 9 outputs a plurality of clock signals whose oscillation frequencies are changed based on the control voltage output from the low-pass filter 8. These clock signals are composed of clocks having the same period in an m-phase and each obtained by shifting the phase by 1/m of the period. These clock signals are referred to as clock signals vco0, vco1, vco2, vco3, vco4, . . . to vcom-1 in the order of phase shift, respectively.

The frequency divider 10 is coupled to the output portion of the voltage controlled oscillator 9. The frequency divider 10 frequency-divides the clock signal vco1 generated by the voltage controlled oscillator 9, and outputs it as the feedback clock signal fFB.

A coupling is made such that the clock signal vco0, that is, the first clock signal is input to the frequency divider 13. The coupling is made such that a clock signal frequency-divided by the frequency divider 13, the clock signal vco0 output from the voltage controlled oscillator 9 and the clock signals vco1, vco2, vco3, vco4, . . . to vcom-1, that is, the second clock signals are input to the phase selection/generator 11, respectively.

The phase selection/generator 11 is controlled by the control circuit 12; the input portion of the frequency divider 4 is coupled to the output portion of the phase selection/generator 11.

FIG. 2 is a block diagram showing an example of the configuration of the phase selection/generator 11.

As shown in the figure, the phase selection/generator 11 includes a plurality of flip-flops $14_1$ to $14_N$, a selector 15 and a phase interpolation circuit 16. The flip-flops $14_1$ to $14_N$, which constitute a frequency-divided clock generator, are composed of, for example, D-type flip-flops.

A coupling is made such that the clock signals vco1, . . . vcom-1 and vco0 are input to the clock terminals ck of the flip-flops $14_1$ to $14_N$, respectively. The output portion of the frequency divider 13 is coupled to the data terminals D of the flip-flops $14_1$ to $14_N$.

The input portion of the selector 15, which is a frequency-divided clock selector, is coupled to the output terminals Q of the flip-flops $14_1$ to $14_N$, respectively. Based on a selection signal sel of the control circuit 12, the selector 15 selects signals output from any two flip-flops among the flip-flops $14_1$ to $14_N$, and outputs them to the phase interpolation circuit 16. A signal output from the phase interpolation circuit 16 is an output clock fout1 of the SSC.

The operation of the clock generation circuit 1 will now be described.

The clock signal vco1 output from the voltage controlled oscillator 9 is frequency-divided by the frequency divider 13, and is output as a frequency-divided clock ph0 to the selector 15. The frequency divider 13 switches a frequency division ratio between, for example, two types, that is, P and (P+1) based on a control signal Pcon, which is a frequency division ratio switching signal for setting the frequency division number output from the control circuit 12.

As described above, the frequency-divided clock ph0 is input to the data terminals D of the flip-flops $14_1$ to $14_N$, and the clock signals vco1, . . . vcom-1 which are output from the voltage controlled oscillator 9 and whose phases are shifted are input to the clock terminals ck of the flip-flops $14_1$ to $14_N$, respectively, with the result that the outputs of the flip-flops $14_1$ to $14_N$ become frequency-divided clocks ph1 to phm, respectively, which have the same period and whose phases are each shifted by 1/m of the period.

Since the clock signal vco0 input to the frequency divider 13 is input to the clock terminal ck of the flip-flop $14_N$, the output of the flip-flop $14_N$ is a frequency-divided clock whose phase is shifted by a phase corresponding to an output period of the voltage controlled oscillator 9 with respect to the frequency-divided clock ph0 output from the frequency divider 13.

FIG. 3 is a timing chart showing an example of the relationship between multiphase clock signals output from the voltage controlled oscillator 9, the frequency-divided clock output from the frequency divider 13 and multiphase frequency-divided clocks output from the flip-flops $14_1$ to $14_N$.

FIG. 3 shows, from top to bottom, the signal timing of the multiphase clock signals vco0, . . . vcom-1 output from the voltage controlled oscillator 9, the frequency-divided clock ph0 output from the frequency divider 13 and the multiphase frequency-divided clocks ph1 to phm output from the flip-flops $14_1$ to $14_N$. The example of FIG. 3 shows a case where the frequency division ratio P=4.

To the selector 15 are input (m+1) multiphase frequency-divided clocks ph0 to phm generated by the frequency divider 13 and the flip-flops $14_1$ to $14_N$, respectively. The selector 15 selectively outputs two frequency-divided clocks (phj and phj+1) having adjacent phase shifts from among the frequency-divided clocks ph0 to phm that have been input.

FIG. 4 is a circuit diagram showing an example of the configuration of the selector 15.

The selector 15 is composed of clocked inverter groups $17_1$ to $17_m$ which are wired-OR-coupled and inverters 18 and 19. Each of the clocked inverter groups $17_1$ to $17_m$ includes two clocked inverters Iv1 and Iv2.

The coupling is made such that the frequency-divided clock ph0 is input to the input portion of the clocked inverter Iv1 of the clocked inverter group $17_1$, and that the frequency-divided clock ph1 is input to the input portion of the clocked inverter Iv2 of the clocked inverter group $17_1$.

The coupling is made such that the frequency-divided clock ph1 is input to the input portion of the clocked inverter Iv1 of the clocked inverter group $17_2$, and that the frequency-divided clock ph2 is input to the clocked inverter Iv2 of the clocked inverter group $17_2$. Likewise, the coupling is made such that the frequency-divided clocks ph2 to phm-1 are input to the input portions of the clocked inverters Iv1 of the clocked inverter groups $17_3$ to $17_m$, respectively, and that the frequency-divided clocks ph3 to phm are input to the clocked inverters Iv2 of the clocked inverter groups $17_3$ to $17_m$, respectively.

A signal from the clocked inverter group to which only one activated selection signal among selection signals sel (1 to m) output from the control circuit 12 is input is selected; the frequency-divided clocks phj and phj+1 are output through the inverters 18 and 19, respectively.

The output of the clocked inverter group to which an inactive selection signal is input is brought into a Hi-Z state. The phase difference between the frequency-divided clocks phj and phj+1 selected by the selector 15 is 1/m of the signal output period of the voltage controlled oscillator 9.

Then, the two frequency-divided clocks phj and phj+1 output from the selector 15 are input to the phase interpolation circuit 16. The phase interpolation circuit 16 phase-shifts the frequency-divided clock by a phase shift obtained by further dividing the phase difference between the input signals based on a weighting data signal A output from the control circuit 12.

Then, the output signal from the phase interpolation circuit 16 is output as the output clock fout1. When there are n types of weighting data signals A, a phase shift obtained by dividing into n pieces the phase difference between input frequency-divided clocks is made, and its step amount is 1/(m·n) of the signal output period of the voltage controlled oscillator 9.

FIG. 5 is a circuit diagram showing an example of the configuration of the phase interpolation circuit 16.

The selected frequency-divided clocks phj and phj+1 are converted through a differential signal conversion circuit 20 into differential signals phj, /phj, phj+1 and /phj+1, and they are input to a differential pair of transistors M3 and M4 and a differential pair of transistors M5 and M6, which serve as current switches.

The load MOS transistors of these differential pairs are transistors M7 and M8 in common. A tail current source 21 of each of the differential pairs has a block unit containing transistors MnA and MnB and enclosed by alternate long and short dashed lines, and the block units are coupled in parallel according to the number of types of weighting data.

The source voltage of the MOS transistor is reversed according to the value of the weighting data A (1 to n), and thus either of the transistors MnA and MnB is activated, and the other becomes inactive. Hence, the total number of the activated transistors MnA and MnB is invariably a constant value n irrespective of the weighting data.

A decoder 22 outputs an enable signal Enable based on an n-setting signal output from the control circuit 12. The enable signal Enable makes both of the transistors MnA and MnB in the tail current source inactive, and can vary the value of the number n of the weighting data. When the value of an increase in "Edge No." (FIG. 7) is assumed to be X, the period To of the output clock fout1 is expressed by the equation "To=Tosc×{P+X/(m×n)}" and is an output obtained by fractional-frequency-dividing the output of the voltage controlled oscillator 9. The number n of the weighting data of the phase interpolation circuit 16 can be variably set by the n-setting signal, and the output clock fout1 whose fractional frequency division ratio can be varied is obtained.

The operation will be described below.

For ease of understanding, the sizes of transistors are assumed such that transistor M1=transistor MnA=transistor MnB, transistor M7=transistor M8=transistor M9=transistor M11 and transistor M10=transistor M12.

When the frequency-divided clocks phj and phj+1 are low signals (=reference potential VSS level), the transistors M3 and M5 are turned on, the transistors M4 and M6 are turned off and thus the tail current of the activated transistor MnA flows through the load MOS transistor M7 via the transistor M3 and the tail current of the activated transistor MnB also flows through the load MOS transistor M7 via the transistor M5. The total of the tail currents is n·IB as described above.

On the other hand, since the transistors M4 and M6 are off, no current flows through the load MOS transistor M8. The currents through the transistors M7 and M8 are transferred to the transistors M12 and M11, and the voltage of a drain node is determined by a difference current.

Since the current through the transistor M11 is zero, and the current through the transistor M12 is n·IB, the output clock fout1 is a low signal.

Subsequently, when the frequency-divided clock phj changes from a low signal to a high signal, and the frequency-divided clock phj+1 having a different phase remains a low signal, the transistors M4 and M5 are turned on, the transistors M3 and M6 are turned off and thus the tail current of the activated transistor MnA flows through the transistor M8 and the tail current of the activated transistor MnB flows through the transistor M7.

The difference current such as a current (the current of the activated transistor MnA—the current of the activated transistor MnB) flows, as the charging current of the node, through the drain node of the transistors M11 and M12 that serves as an output portion.

Consequently, an output potential generates transitional change according to the ratio of each tail current, and a delay time changes according to the value of the weighting data. Furthermore, when the frequency-divided clock phj+1 changes to a high signal, the transistors M4 and M6 are turned on, the transistors M3 and M5 are turned off and thus the current through the transistor M7 becomes zero, and the current through the transistor M8 becomes n·IB, with the result that the output clock fout1 finally transits to a high signal.

Since each delay time on the weighting data increases with the difference current with reference to the delay time from the input of the frequency-divided clock phj+1 to the output clock fout1 when the transistor MnA alone is activated, as shown in FIG. 6, it is possible to obtain the output clock fout1 produced by apparently performing phase shift between the frequency-divided clocks phj and phj+1 according to the weighting data and outputting them.

Since, in this configuration, the output clock fout1 expressed by the selection signal sel (1 to m) and the weighting data signal A (1 to n) has m·n types of value, it is possible to output, from the frequency-divided clocks phj and phj+1, the output clocks fout1 having the different relative delay times (the different phase shifts) as shown in FIG. 7.

Here, in FIG. 7, "Edge No."=0 of fout1 shown in an upper left portion indicates the frequency-divided clock ph0 that has passed through the above configuration and that is output as the output clock fout1, and this is assumed to be the reference.

Although the period of the frequency-divided clock ph0 is fixed to be p×Tosc, the period of the output clock fout1 when the selection signal sel and the weighting data signal A are changed for each of the frequency-divided clocks will be considered here.

For example, when, in the "Edge No." of fout1 shown in FIG. 7, the "Edge No." of fout1 is changed from 0 to 1 to 2 to 3 . . . for each of the frequency-divided clocks, the relative delay time is increased by Δ each time, and thus the period of the output clock fout1 is (p×Tosc+Δ). This corresponds to an output clock fout1 (A) shown in FIG. 8.

Likewise, when the "Edge No." is selectably changed from 0 to 2 to 4 to 6 . . . , the relative delay time is increased by 2Δ each time, and thus the period of the output clock fout1 is (p×Tosc+2Δ).

By selectably changing the "Edge No." to change the increased amount in this way, it is possible to change the period of the output clock fout1. As indicated by the output clock fout1 (B) shown in FIG. 8, by changing the increased amount from Δ to 2Δ to 3Δ . . . each time, it is possible to sequentially increase and change the output period from p×Tosc to p×Tosc+Δ to p×Tosc+2Δ to p×Tosc+3Δ . . . .

The above-described selections of the edges are combined, and thus the output clock fout1 having a modulation period of a triangular wave as shown in FIG. 8 is output. The selected "Edge No." is calculated by adding the increased value to the current "Edge No.".

The "Edge No." of the selectable output clock fout1 does not cover all the periods of the frequency-divided clock (p×Tosc), and covers only one period of the voltage controlled oscillator 9, and hence, when the calculated "Edge No." exceeds the maximum value, the frequency division ratio of the frequency divider 13 is switched from P to (P+1) and the "Edge No." is also switched to the remainder value after the calculation.

Thereafter, the frequency division ratio is switched back to P, and the same calculation as before overflow is performed to select the "Edge No." By repeating this, it is possible to cover all the periods of the frequency-divided clock.

The control circuit 12 calculates the "Edge No." so that the period of a triangular wave modulation waveform and a modulation ratio are predetermined values, and provides the corresponding selection signal sel and weighting data A to the selector 15 and the phase interpolation circuit 16.

The control circuit 12 is operated by the most delayed frequency-divided clock phm among feedback frequency-divided clocks during which the signals are stable so as not to produce a glitch resulting from the forward/backward switching of the "Edge No.".

FIG. 9 is a flowchart showing an example of the operation of the control circuit 12.

The control circuit 12 first sets the maximum value δmax of the increased amount Δ(δ) and the number Kmax of repetitions of the same increased value from the period of the required modulation frequency and the modulation ratio (step S101).

The initial value setting is performed for Φ corresponding to the "Edge No." of the relative delay time, δd indicating an increase or decrease in the increased amount Δ(δ) and the like (step S102).

Subsequently, for each of the frequency-divided clocks phm, the number k of repetitions, the phase shifts δ and δd and the relative delay time Φ (Edge No.) are calculated (step S103), and, based on the calculation results, the selection signal sel of the selector 15, the weighting data signal A of the phase interpolation circuit 16 and the control signal Pcon of the frequency divider 13 are set (step S104). Such control is performed for each of the frequency-divided clocks phm, and thus the output clock fout1 of SSC output period shown in FIG. 8 is obtained.

Since the waveform of the period of any output clock fout1 can be output according to the way in which the "Edge No." is selected from the control circuit 12, the function of changing the period of the triangular wave modulation waveform as appropriate instead of fixing it is provided, and thus, it is possible to reduce a fixed spurious portion occurring in the output.

In this way, according to the present embodiment, it is possible to reduce the circuit area of the spread spectrum clock generator 3 by configuring the spread spectrum clock generator 3 without use of the PLL including a low-pass filter and the like.

Since band limitation produced by the filter or the like is eliminated, it is possible not only to arbitrarily set the modulation frequency by the control circuit 12 but also to obtain an output equal to a modulation waveform set by the control circuit 12 without the attenuation and the like of a harmonics.

Furthermore, since jitter, which is the deviation between periods of the modulation output, is determined by the minimum phase shift value of the phase interpolation circuit, it is possible to reduce it in a design.

Moreover, since the spread spectrum clock generator 3 is formed with logic circuits, it is possible to easily perform process porting.

Although the invention designed by the present inventors is specifically described above based on the embodiment, the present invention is not limited to the embodiment described above; it goes without saying that many modifications are possible without departing from the spirit of the present invention.

The present invention is suitable for a semiconductor integrated circuit device including a clock generator that generates an SSC slightly varying the frequency of clock signal and a normal clock signal other than the SSC.

What is claimed is:

1. A semiconductor integrated circuit device comprising a clock generation circuit that includes:
    a PLL generating a first clock signal equal in frequency to a reference clock signal and a plurality of second clock signals each arbitrarily shifted in phase from the first clock signal; and
    a spread spectrum clock generator generating a frequency modulation clock signal which modulates the frequencies of the first and second clock signals generated by the PLL to spread an electromagnetic spectrum,
    wherein the spread spectrum clock generator includes:
        a frequency divider that frequency-divides the first clock signal output from the PLL;
        a frequency-divided clock generator that outputs a frequency-divided signal frequency-divided by the frequency divider based on the phase-shifted second clock signals output from the PLL to generate phase-shifted multiphase frequency-divided clocks;
        a frequency-divided clock selector that selects and outputs any two frequency-divided clocks whose phases are different from and closest to each other from among the multiphase frequency-divided clocks generated by the frequency-divided clock generator;
        a phase interpolation circuit that phase-shifts the frequency-divided clock by a phase shift obtained by dividing the phase difference between the two frequency-divided clocks from the two frequency-divided clocks selected by the frequency-divided clock selector and that outputs the resultant clock as the frequency modulation clock signal; and
        a control circuit that controls the frequency-divided clock selector and the phase interpolation circuit such that a period of the frequency modulation clock signal output from the phase interpolation circuit differs from a period of the first clock signal output form the PLL.

2. The semiconductor integrated circuit device according to claim 1,
    wherein the control circuit outputs to the frequency-divided clock selector a selection signal that controls so as to select and output any two frequency-divided clocks from among the multiphase frequency-divided clocks output from the frequency-divided clock generator, outputs to the phase interpolation circuit weighting data for the phase interpolation circuit to divide the phase difference between the frequency-divided clocks output from the frequency-divided clock selector, and performs control so that the frequency modulation clock output from the phase interpolation circuit changes a frequency thereof at any period.

3. The semiconductor integrated circuit device according to claim 1,
wherein the frequency divider arbitrarily switches a frequency division ratio based on a frequency-division-ratio switching signal output from the control signal, and
wherein the control circuit controls so as to switch the frequency division ratio each time the phase shift of the frequency modulation clock output from the phase interpolation circuit exceeds one period of the first clock signal output from the PLL.

4. The semiconductor integrated circuit device according to claim 1,
wherein the control circuit operates in synchronization with the most delayed frequency-divided clock among the multiphase frequency-divided clocks output from the frequency-divided clock generator.

5. The semiconductor integrated circuit device according to claim 2,
wherein the frequency divider arbitrarily switches a frequency division ratio based on a frequency-division-ratio switching signal output from the control signal, and
wherein the control circuit controls so as to switch the frequency division ratio each time the phase shift of the frequency modulation clock output from the phase interpolation circuit exceeds one period of the first clock signal output from the PLL.

6. The semiconductor integrated circuit device according to claim 2,
wherein the control circuit operates in synchronization with the most delayed frequency-divided clock among the multiphase frequency-divided clocks output from the frequency-divided clock generator.

7. The semiconductor integrated circuit device according to claim 3,
wherein the control circuit operates in synchronization with the most delayed frequency-divided clock among the multiphase frequency-divided clocks output from the frequency-divided clock generator.

* * * * *